United States Patent [19]
Dai et al.

[11] Patent Number: 5,710,076
[45] Date of Patent: Jan. 20, 1998

[54] METHOD FOR FABRICATING A SUB-HALF MICRON MOSFET DEVICE WITH GLOBAL PLANARIZATION OF INSULATOR FILLED SHALLOW TRENCHES, VIA THE USE OF A BOTTOM ANTI-REFLECTIVE COATING

[75] Inventors: Chang-Ming Dai; Horng-Chang Dai, both of Hsinchu; Chin-Lung Lin, Kaoshiung, all of Taiwan

[73] Assignee: Industrial Technology Research Institute, Hsinchu, Taiwan

[21] Appl. No.: 707,038

[22] Filed: Sep. 3, 1996

[51] Int. Cl.$^6$ .................................................. H01L 21/336
[52] U.S. Cl. ........................................ 438/305; 438/427
[58] Field of Search ..................................... 438/296, 301, 438/303, 305, 306, 424, 427, 551

[56] References Cited

U.S. PATENT DOCUMENTS

| | | | |
|---|---|---|---|
| 4,927,777 | 5/1990 | Hsu et al. | 438/305 |
| 5,077,234 | 12/1991 | Scoopo et al. | 438/427 |
| 5,362,669 | 11/1994 | Boyd et al. | 438/427 |
| 5,428,240 | 6/1995 | Lur | 438/305 |

OTHER PUBLICATIONS

"Effect of Circuit Structure on Planarization Resist Thickness" by R.H. Wilson et al, pub in J. Electrochem Soc. Solid–State Science And Technology, May 1986 pp. 981–984.

"Two Layer Planarization Process" by A. Schlitz et al, pub in J. Electrochem Soc. Solid–State Science And Technology, Jan. 1986, pp. 178–181.

"Application Of A Two–Layer Planarization Process To VLSI Intermetal Dielectric And Trench Isolation Processes", pub in IEEE Trans on Semi Manufacturing, vol. 1, No. 4, Nov. 1988 pp. 140–145.

"Planarization of VLSI Topography Over Variable Pattern Densities" by T.H. Daubenspeck et al., pub in J. Electrochem Soc. vol. 138, Feb. 1991, pp. 506–509.

*Primary Examiner*—Chandra Chaudhari
*Attorney, Agent, or Firm*—George O. Saile; Stephen B. Ackerman

[57] ABSTRACT

A process for globally planarizing the insulator used to fill narrow and wide shallow trenches, used in a MOSFET device, structure, has been developed. The process features smoothing the topography that exists after the insulator filling of narrow and shallow trenches, via use of a two layer planarization composite, consisting of an underlying, anti-reflective coating, which enhances the flow of an overlying photoresist layer. A two phase, RIE procedure is then employed, with the initial phase exposing thick insulator in narrow shallow trench regions, but leaving the two layer planarization composite protecting the thinner insulator in the wide shallow trenches. The second phase of the RIE procedure removes thick insulator, overlying the narrow shallow trenches, resulting in a planarized topography.

26 Claims, 3 Drawing Sheets

METHOD FOR FABRICATING A SUB-HALF MICRON MOSFET DEVICE WITH GLOBAL PLANARIZATION OF INSULATOR FILLED SHALLOW TRENCHES, VIA THE USE OF A BOTTOM ANTI-REFLECTIVE COATING

BACKGROUND OF THE INVENTION (1) Field of the Invention

This invention relates to a method of fabricating semiconductor devices, and more specifically to a method for global planarization of the insulator material used to fill shallow trenches in semiconductor devices.

(2) Description of the Prior Art

The ability of the semiconductor industry, to create devices with sub-micron features, or micro-miniaturization, has resulted in the objectives of increasing device performance, as well as reductions in the fabrication costs of semiconductor devices, to be realized. Photolithography and dry etching are two semiconductor fabrication disciplines, that have allowed the routine attainment of micro-miniaturization to occur. First, the use of more sophisticated exposure cameras, as well as the use of more sensitive photoresist materials have allowed sub-micron images, in photoresist layers, to be achieved. In addition the development of more advanced dry etching tools and etch chemistries, have allowed these sub-micron images in photoresist layers to be successfully transferred to underlying materials, used for the fabrication of sub-micron semiconductor devices. However as advanced semiconductor devices, such as metal oxide semiconductor field effect transistors, (MOSFET), become smaller, specific structural regions of these devices have to be addressed.

Device isolation is normally achieved via the use of thermally grown, field oxide, (FOX), regions. The non-isolation regions, or regions where the active devices will be fabricated, are protected from the thermal oxidation process via the use of a composite oxidation resistant mask, usually comprised of an overlying layer of silicon nitride and an underlying layer of silicon dioxide. However during the creation of the FOX region, via thermal oxidation, field oxide encroachment, or birds beak formation, occurs under the composite oxidation resistant mask, resulting in a loss of active device area. To compensate for birds beak formation, device designers have to enlarge the active device region, to accommodate this phenomena. This increase in active device area, results in a larger semiconductor chip, adversely influencing the performance and cost objectives. In addition the creation of a FOX region results in a non-planar topography, due to the growth of approximately half the thickness of the FOX region above the initial surface of the starting semiconductor substrate, causing difficulties when planarizing, either via chemical mechanical polishing, or reactive ion etching, (RIE). Therefore the semiconductor industry has turned to shallow trench isolation, as a replacement for FOX isolation, for sub-micron MOSFET devices.

Shallow trench isolation, consisting of etching trenches in silicon, filling the trenches with an insulator material, and planarization of the insulator material, is now extensively being used for sub-micron MOSFET fabrication. However device designs demand various shallow trench widths, and various active device region widths, or the width of the spaces between shallow trenches. Therefore since the filling of narrow width trenches demands less insulator material, (due to the convergence of the depositing layers on all sides of the narrow trench), then wider trenches, topography differences will occur in the form of thicker insulator material accumulating over the narrow shallow trenches and spaces between, while a less accumulated insulator material, only sufficient enough to fill the wider trenches, will overlie the wider shallow trenches and spaces. These topography differences can result in difficulties when attempting to planarize the insulator material, using either chemical mechanical polishing, (CMP), or reactive ion etching, (RIE) procedures. Global planarization is difficult to achieve via CMP or RIE procedures due to endpoint sensitivities. This invention will describe a RIE planarization process, using a two layer planarization, (TLP) composite, consisting of an underlying, or bottom anti-reflective coating, (BARC), and an overlying layer of positive photoresist. The BARC layer, enhances the flow of the overlying photoresist layer, thus resulting in a more planar surface, prior to resist etch back, then would not have existed if not for the use of the BARC layer. A resist etch back procedure is then used, first planarizing to a point in which the higher topography insulator region appears, followed by a second etch back procedure, with a etch selectivity designed to remove the high topography insulator regions at a faster rate then the photoresist, still remaining in lower topography insulator regions. Prior art, such as Scopoo, in U.S. Pat. No. 5,077,234, describes using a photoresist plug to fill wide trenches. However that prior art does not teach the use of the critical BARC layer, needed to allow the overlying photoresist layer to effectively furnish the level surface needed for subsequent planarization etch back procedures.

SUMMARY OF THE INVENTION

It is an object of this invention to fabricate sub-half micron MOSFET devices using insulator filled shallow trenches.

It is another object of this invention to fabricate narrow width, shallow trenches, with narrow spaces between the narrow width shallow trenches, as well as fabricating wide, shallow trenches, with wide spaces between trenches.

It is still another object of this invention to completely fill all shallow trenches, with a chemically vapor deposited insulator layer.

It is yet another object of this invention to use a composite planarization layer, to create a level topography prior to etch back of the insulator layer, used for filling various width shallow trenches, with the composite planarization layer comprised of a bottom anti-reflective coating, used to enhance the flow of an overlying photoresist layer, during a bake cycle.

It is still yet another object of this invention to use a two stage RIE procedure, for planarization of the insulator layer, initially using a blanket etchback of photoresist, exposing insulator layer on the higher topography regions, followed by a insulator layer etchback cycle, with etch selectivity designed to remove insulator at a faster rate then the removal rate of photoresist.

In accordance with the present invention a method for fabricating a sub-half micron MOSFET device, using planarized, insulator filled shallow trenches, is described. Shallow trench patterns are etched in a semiconductor substrate, with the shallow trench pattern comprised of narrow width trenches, separated by narrow spaces, with the spaces to be used for subsequent sub-half micron MOSFET devices, as well as wider shallow trenches, used for isolation purposes. A thick layer of insulator is deposited completely filling all trenches, resulting in a higher insulator topography in areas of narrow trenches, and narrow spaces, and lower insulator topography in areas of wide, shallow trenches. A thin anti-reflective coating is applied, and baked, partially filling the low regions of the substrate. A positive layer of photoresist is then applied on the bottom anti-reflective coating, followed by a bake cycle, resulting the composite planarization layer, with the composite layer being thicker overlying wide, shallow trenches, then in area overlying narrow, shallow trenches, and the spaces between the narrow shallow trenches. An initial blanket RIE procedure, of photoresist is performed, to a point in which the insulator layer, in higher topography regions, (overlying narrow shallow trenches), is exposed. A second RIE procedure, designed to remove insulator at a greater rate than photoresist, is used to remove insulator layer from narrow shallow trench regions, and the spaces between the narrow shallow trenches, while leaving some photoresist remaining, overlying insulator filled, wide shallow trenches. A buffered hydrofluoric dip, followed by removal of the remaining photoresist, overlying insulator filled, wide shallow trenches, complete the planarization process. A MOSFET device is next fabricated in the narrow spaces between the narrow shallow trenches via a growth of a gate insulator layer, deposition of a polysilicon layer, patterning to form a polysilicon gate structure, and source and drain processing.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of fabricating a sub-half micron MOSFET device structure using insulator filled, shallow trench isolation, will now be described. A P type, single crystalline substrate, 1, having a <100> crystallographic orientation, is used, and schematically shown in FIG. 1. A thin pad silicon oxide layer, 2, is formed via thermal oxidation procedures, to a thickness between about 50 to 300 Angstroms, followed by the deposition of a silicon nitride layer, 3, obtained via the use of either low pressure chemical vapor deposition, (LPCVD), or plasma enhanced chemical vapor deposition, (LPCVD), procedures, at a temperature between about 450° to 750° C., to a thickness between about 1000 to 2000 Angstroms. A positive photoresist layer, 4, is next applied, and exposed using a shallow trench pattern mask. After development and removal of the exposed positive photoresist regions, a reactive ion etching, (RIE) procedure, is used to transfer the image in the positive photoresist layer, 4, to the underlying semiconductor substrate, 1. The RIE procedure, using $CHF_3$—$CF_4$—Ar as an etchant for silicon nitride layer, 3 and silicon oxide layer, 2, and using HBr—$Cl_2$—$O_2$ as an etchant for semiconductor substrate, 1, creates wide shallow trenches, 5, between about 5 to 100 uM in width, and narrow shallow trenches, 6, between about 0.18 to 1.0 uM in width. The spaces between the narrow shallow trenches, 6, to be subsequently used for a sub-half micron MOSFET device, are between about 0.2 to 20 uM in width.

Figure 1:
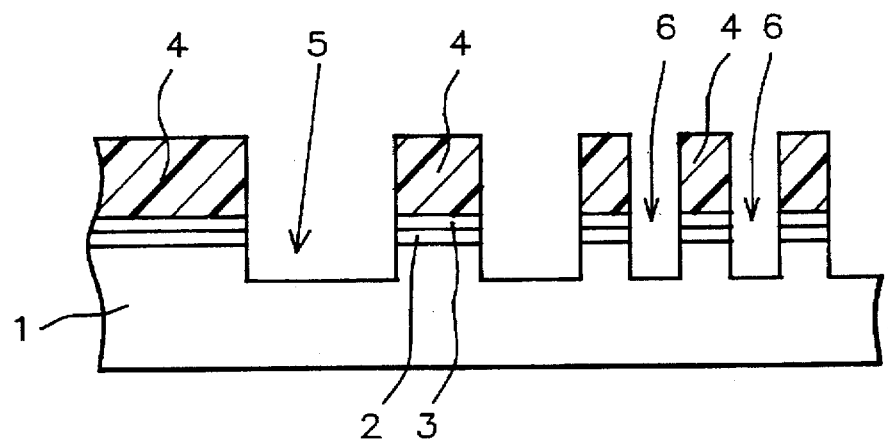
FIGS. 1–7, which schematically, in cross-sectional style, show the fabrication stages used to achieve a planar topography for a semiconductor substrate comprised of narrow and wide, insulator filled shallow trenches, and narrow and wide spaces between the insulator filled shallow trenches.

The depth of the trenches is between about 4000 to 6000 Angstroms. This stage of the process is schematically shown in FIG. 1.

Figure 2:
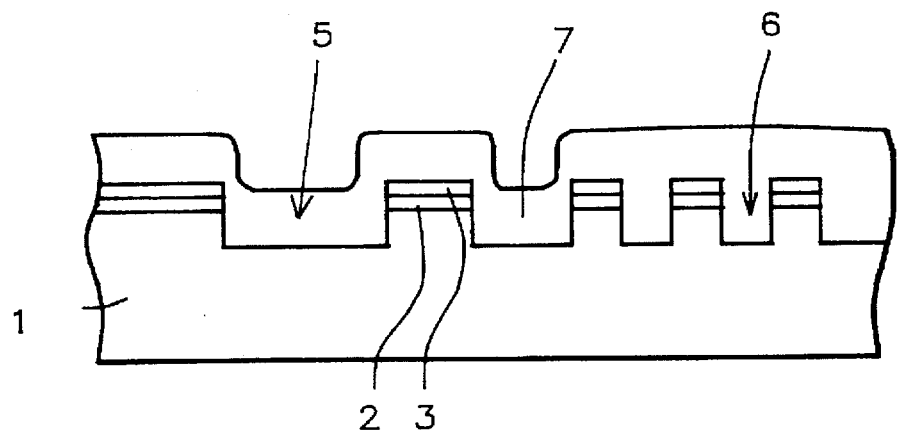

After removal of positive photoresist layer, 4, via plasma oxygen ashing, and careful wet cleans, a layer of silicon oxide, 7, is used to fill all shallow trenches. Silicon oxide layer, 7, is obtained via LPCVD procedures, at a temperature between about 450° to 750° C., to a thickness between about 5000 to 7000 Angstroms, using tetraethylorthosilicate, (TEOS), as a source. FIG. 2, shows the result of this TEOS deposition. The narrow shallow trenches, 6, fill by silicon oxide layer, 7, coating the sides, as well as the bottom, of the narrow shallow trenches, 6. The convergence of the depositing silicon oxide layers on the narrow shallow trench sidewalls, completely fill the narrow shallow trenches, prior to filling the wider shallow trenches, 5, which can only fill by the depositing silicon oxide accumulating on the bottom of the trench. Thus to completely fill the wider shallow trenches, 5, regions of narrow shallow trenches, 6, and the spaces between them, are overfilled. This results in a difference in topography between the narrow shallow trench, and spaces between, and the wider shallow trenches, of between about 5000 to 7000 Angstroms. This shown schematically in FIG. 2.

Figure 3:
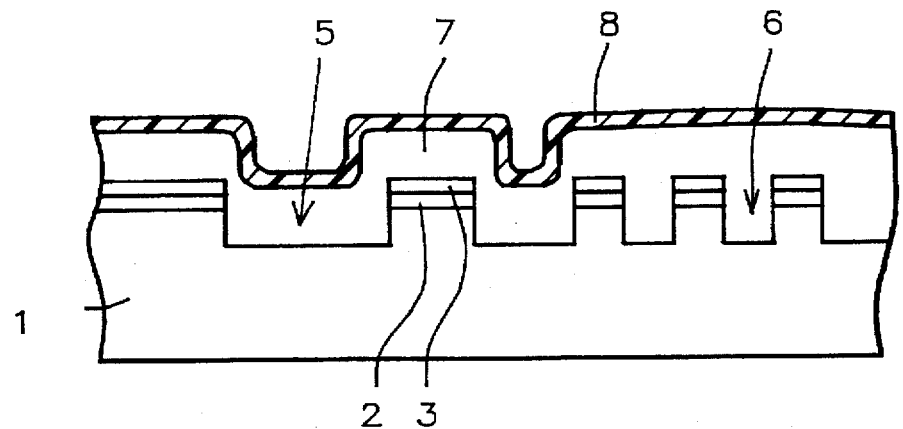
Figure 4:
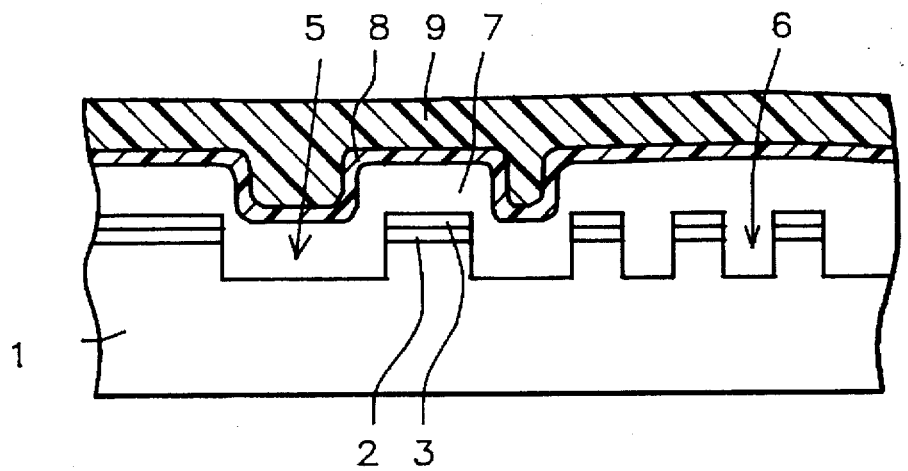

The difference between the higher insulator topography, in narrow shallow trench regions, and the lower insulator topography, in wide shallow trench regions, can present difficulties when attempting to planarize. To enable a smooth topography, across all width shallow trenches, a unique, global planarization process, using a two layer planarization, (TLP), composite, with the lower layer being a bottom anti-reflective coating, (BARC), and a two stage RIE etch procedure, is used. First the (BARC), bottom anti-reflective coating, 8, is applied via conventional spin coating procedures. BARC layer, 8, is applied to a thickness between about 1000 to 2000 Angstroms. A bake, at a temperature between about 200° to 250° C. is next performed and due to the low viscosity of this layer, the insulator filled, wide shallow trenches, 5, as well as the insulator overlying the narrow shallow trenches, and spaces between, are successfully coated. This is schematically displayed in FIG. 3. The overlying layer of the TLP composite, a positive photoresist layer, 9, with a thickness between about 0.6 to 1.5 uM, is next applied. The surface of the underlying BARC layer, 8, enhances the flow of positive photoresist layer, 9, after a bake of positive photoresist layer, 9, at a temperature between 200° to 250° C., resulting in a smooth TLP composite overlying the insulator filled trenches and spaces. This is shown schematically in FIG. 4. The TLP composite, overlying the insulator filled, wide shallow trench, 5, is between about 1500 to 3000 Angstroms thicker, than in regions where thinner TLP composite overlaid higher insulator topography, that is insulator filled, narrow trenches, and the spaces between. It is important to this invention that the differences in TLP composite thickness, overlying high versus low insulator topographies, be greater then about 1200 Angstroms, specifically for the second phase of the RIE etch back procedure in which protection, in the form of TLP coverage, is needed during the long etchback of thick insulator.

Figure 5:
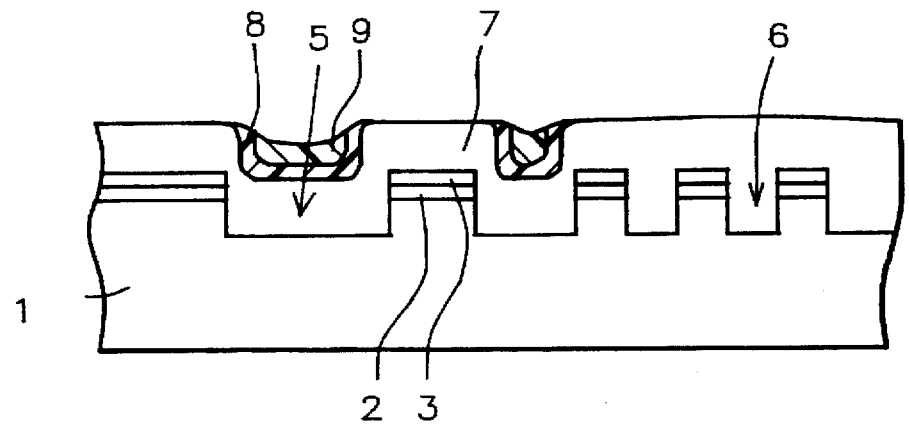
Figure 6:
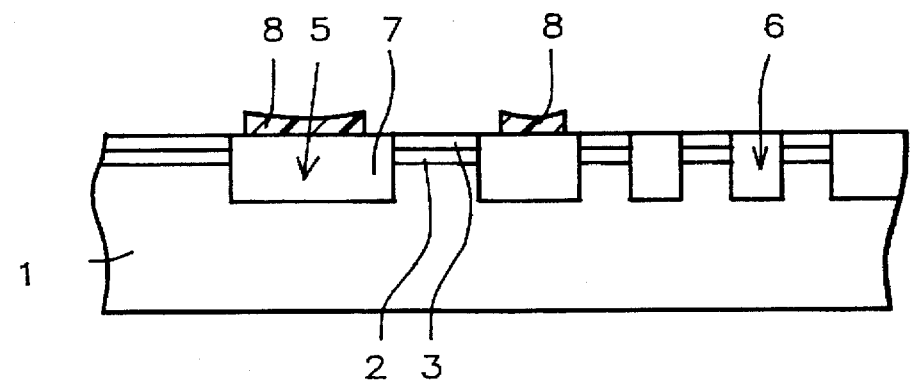
Figure 7:
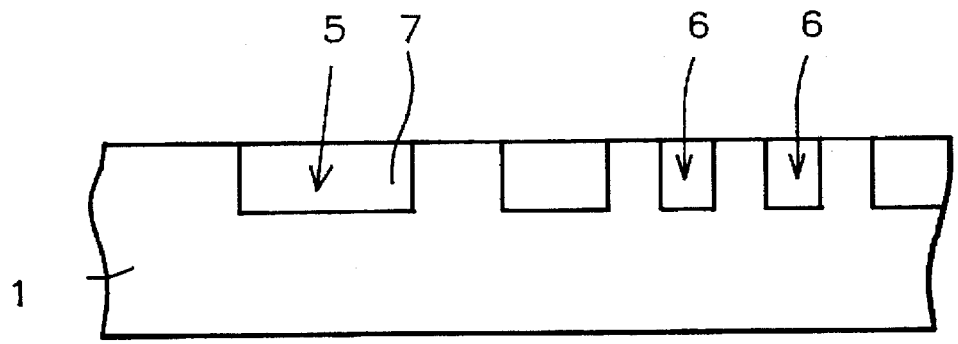

The initial RIE etch back phase is a blanket dry etch of the TLP composite, using $O_2$—$CHF_3$—Ar as an etchant. This procedure is performed to a point in which the insulator layer, 7, is exposed in regions of high topography, specifically in regions where insulator layer, 7, overlies insulator filled, narrow shallow trenches, 6, as well as the spaces between the insulator filled, narrow shallow trenches. At the conclusion of this RIE etch back phase, some TLP composite still remains in the lower topography regions, specifically overlying insulator filled, wide shallow trenches, 5. This is schematically shown in FIG. 5. The second phase of the RIE etch back procedure is performed using $CHF_3$—$CF_4$—Ar as an etchant. The selectivity of insulator layer, 7, to TLP composite is about 10 to 3, therefore allowing insulator layer, 7, to be completely removed in high topography regions, including an additional overetch performed to insure insulator layer, 7, removal, while still leaving TLP composite, to protect insulator layer, 7, in the wide shallow trench regions, 5. This phase is performed to a point in which insulator layer, 7, is removed the in high topography regions, exposing the top surface of insulator filled, narrow shallow trenches, 6, while also exposing silicon nitride layer, 3, located between the insulator filled, narrow shallow trenches, 5. Silicon nitride layer, 3, with a thickness of about 1500 Angstroms, can tolerate the RIE overetch cycle. This is schematically shown in FIG. 6. Finally a wet dip, in a buffered hydrofluoric acid solution, is performed, followed by removal of the remaining TLP composite, via plasma oxygen ashing, exposing the top surface of insulator filled, wide shallow trenches, 5. Silicon nitride layer, 3, is then removed via use of a hot phosphoric acid solution, followed by the removal of pad oxide layer, 2, again via the use of a buffered hydrofluoric acid solution. The resulting planarized structure of insulator filled, wide shallow trenches, 5, and insulator filled, narrow shallow trenches, 6, equal in topography to the adjacent spaces between them, are shown schematically in FIG. 7.

Figure 8:
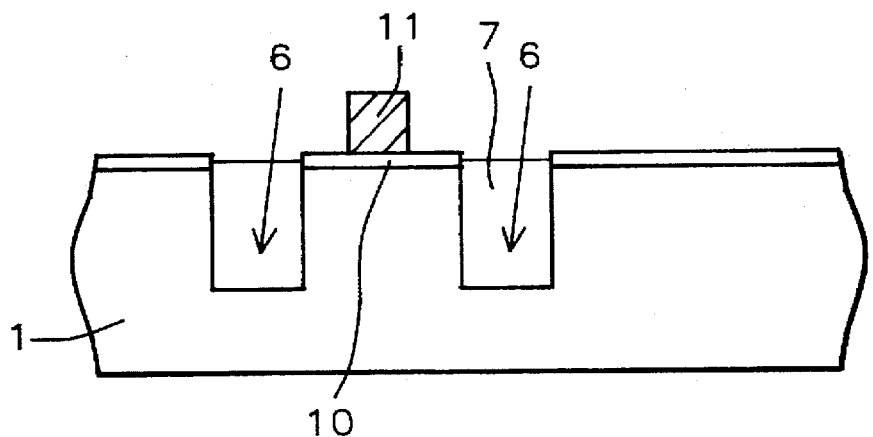
FIGS. 8–9, which schematically, in cross-sectional style, show the fabrication of a sub-half micron MOSFET device structure, in the narrow space between insulator filled, narrow shallow trenches.
Figure 9:
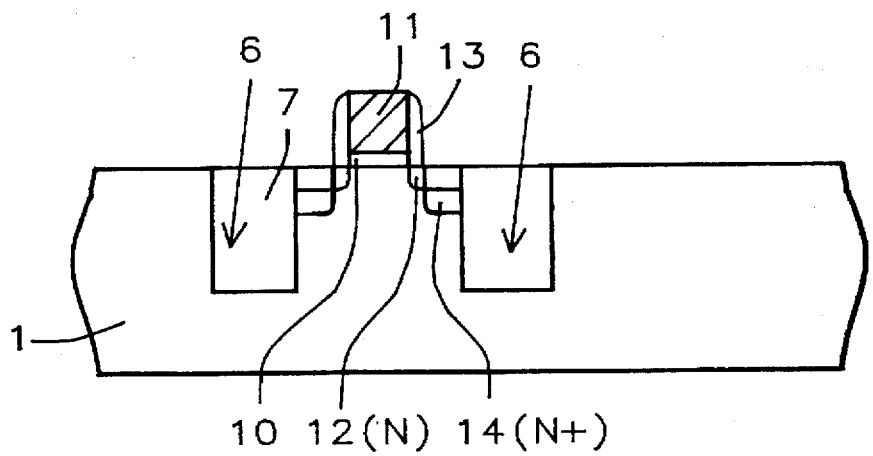

FIGS. 8–9, schematically show the stages of fabrication used to create a sub-half micron MOSFET device, in the spaces between narrow shallow trenches, 6. The space between narrow, shallow trenches, 6, is between about 0.2 to 2 uM. First a silicon dioxide layer, 10, used for the gate insulator layer, is thermally grown in an oxygen—steam ambient, at a temperature between about 850° to 950° C., to a thickness between about 50 to 250 Angstroms. Next a polysilicon layer is deposited using LPCVD procedures at a temperature between about 500° to 800° C., to a thickness between about 1000 to 4000 Angstroms. The polysilicon can be grown using in-situ doping procedures by incorporation of either arsine or phosphine to a silane ambient, or grown intrinsically and doped via ion implantation of either arsenic or phosphorous, at an energy between about 25 to 75 KeV, at a dose between about 5E14 to 1E16 atoms/$cm^2$. Patterning of the polysilicon layer is accomplished via photolithographic and dry etching procedures, using HBr—$Cl_2$ as an etchant, to create polysilicon gate structure, 11, schematically shown in FIG. 8, after photoresist removal. The width of polysilicon gate structure, 11, for the sub-micron MOSFET device, is between about 0.2 to 2 uM. A lightly doped source and drain region, 12, is created via ion implantation of phosphorous, at an energy between about 25 to 100 KeV, at a dose between about 1E12 to 1E14 atoms/$cm^2$. A layer of silicon oxide is next deposited, using LPCVD or PECVD procedures, at a temperature between about 450° to 750° C., to a thickness between about 1000 to 3000 Angstroms. Anisotropic RIE procedures are employed, using $CHF_3$ as an etchant, to create insulator sidewall spacer, 13, schematically shown in FIG. 9. Finally a heavily doped source and drain region, 14, is formed, via ion implantation of arsenic, at an energy between about 50 to 150 KeV, at a dose between about 1E14 to 5E15 atoms/$cm^2$. The resulting sub-half micron MOSFET device, shown schematically in FIG. 9, in the narrow space between narrow shallow trenches, 6, has a channel length between about 0.2 to 20 uM.

This process for fabricating a sub-half micron MOSFET device, using insulator filled shallow trenches planarized via use of a TLP composite, using a BARC underlying layer, although shown applied to N channel MOSFET devices, can also be applied to P channel MOSFET devices. This invention can also be used for CMOS, (complimentary), or BiCMOS devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, with silicon oxide filled shallow trenches, comprising the steps of:

growing a first silicon oxide layer on said semiconductor substrate;

depositing a silicon nitride layer on said first silicon oxide layer;

applying a first positive photoresist layer on said silicon nitride layer;

developing narrow and wide features in said first positive photoresist layer using a shallow trench pattern exposure mask;

anisotropic dry etching, using said narrow and said wide features, in said first photoresist layer as a mask, to create said narrow and wide features in said silicon nitride layer, in said first silicon oxide layer, and continuing said anisotropic dry etching to create narrow and wide shallow trenches in said semiconductor substrate;

removal of said first positive photoresist layer;

depositing a second silicon oxide layer, completely filling said narrow shallow trenches, and completely filling said wide shallow trenches, creating an uneven topography, comprised of a thick layer of said second silicon oxide, overlying silicon oxide filled, narrow shallow trenches, and overlying spaces between said silicon oxide filled, narrow shallow trenches, and of a thin layer of said second silicon oxide in wide shallow trenches;

applying an anti-reflective coating on said second silicon oxide layer;

baking of said anti-reflective coating;

applying a second positive photoresist layer on said anti-reflective coating, creating a two layer planarization composite, comprised of said second positive photoresist layer, overlying said anti-reflective coating;

baking of said second positive photoresist layer, creating a level surface topography of said two layer planarization composite, with a thicker layer of said two layer planarization composite overlying said thin second silicon oxide layer, in said wide shallow trenches, and a thinner layer of said two layer planarization composite overlying said thick second silicon oxide layer, which overlies said silicon oxide filled, narrow, shallow trenches, and the spaces between said silicon oxide filled, narrow shallow trenches;

a first planarization procedure, via dry etching, to completely remove said thinner layer, of said two layer planarization composite, from regions overlying said thick second silicon oxide layer, exposing the top surface of said thick second silicon oxide layer, while leaving some of said thicker layer, of said two layer planarization composite, in regions overlying said thin second silicon oxide layer, in said wide, shallow trenches;

a second planarization procedure, using dry etching, to completely remove said thick second silicon oxide layer, from the top surface of the spaces between said silicon oxide filled, narrow shallow trenches, exposing said silicon nitride layer, and removing said thick second silicon oxide layer, overlying said silicon oxide filled, narrow shallow trenches, creating a level topography between: said silicon oxide filled narrow trenches; the spaces between said silicon oxide filled, narrow shallow trenches; and said thin second silicon oxide layer, in said wide, shallow trenches, still covered with portion of said thick layer of two layer planarization composite;

a buffered hydrofluoric acid procedure;

removal of remaining said thick layer of two layer planarization composite;

removal of said silicon nitride layer;

removal of said first silicon oxide layer;

growing a third silicon oxide layer, to be used as the gate insulator layer;

depositing a polysilicon layer;

patterning of said polysilicon layer to create a polysilicon gate structure, on said gate insulator layer, in the space between said silicon oxide filled, narrow shallow trenches;

ion implanting a first conductivity imparting dopant into said semiconductor substrate, in the space between said silicon oxide filled, narrow shallow trenches, and not covered by said polysilicon gate structure, to create lightly doped source and drain region;

depositing a fourth silicon oxide layer;

anisotropic dry etching of said fourth silicon oxide layer, to create an insulator spacer on the sides of said polysilicon gate structure; and ion implanting a second conductivity imparting dopant into said semiconductor substrate, in the space between said silicon oxide filled, narrow shallow trenches, and not covered by said polysilicon gate structure, and not covered by said insulator spacer, to create heavily doped source and drain regions.

2. The method of claim 1, wherein said narrow shallow trench is created via RIE procedures, using $HBr-Cl_2-O_2$ as an etchant, to a depth between about 4000 to 6000 Angstroms, with a width between about 0.18 to 1.0 uM, with the spaces between said narrow shallow trench, to be used for said MOSFET device, being between about 0.2 to 20 uM in width.

3. The method of claim 1, wherein said wide shallow trench is created via RIE procedures, using $HBr-Cl_2-O_2$ as an etchant, to a depth between about 4000 to 6000 Angstroms, and with a width between about 5 to 100 uM.

4. The method of claim 1, wherein said second silicon oxide layer, used to fill said narrow and wide shallow trenches, is obtained via LPCVD procedures, at a temperature between about 450° to 750° C., to a thickness between about 5000 to 7000 Angstroms, using tetraethylorthosilicate as a source.

5. The method of claim 1, wherein the topography difference in height between said thick silicon oxide layer, overlying said silicon oxide filled, narrow shallow trench, and said thin silicon oxide layer, in said wide shallow trench, is between about 5000 to 7000 Angstroms.

6. The method of claim 1, wherein bottom layer of said two layer planarization composite, is said anti-reflective coating, applied to a thickness between 1000 to 2000 Angstroms.

7. The method of claim 1, wherein said anti-reflective coating is baked at a temperature between about 200° to 250° C.

8. The method of claim 1, wherein said second positive photoresist layer, is baked at a temperature between about 200° to 250° C.

9. The method of claim 1, wherein said two layer planarization composite is between about 1500 to 3000 Angstroms thicker in regions overlying said thin second silicon oxide layer, then in regions overlying said thick second silicon oxide layer.

10. The method of claim 1, wherein said first planarization procedure is performed via RIE procedures, using $O_2-CHF_3-Ar$ as an etchant.

11. The method of claim 1, wherein said second planarization procedure is performed via RIE procedures, using $CHF_3-CF_4-Ar$ as an etchant, with an etch ratio between silicon oxide and photoresist of about 10 to 3.

12. The method of claim 1, wherein said polysilicon gate structure is between about 0.2 to 2.0 uM, in width.

13. The method of claim 1, wherein the channel length of said MOSFET device, fabricated in the space between said narrow shallow trenches, is between about 0.2 to 2.0 uM.

14. A method of fabricating a sub-half micron MOSFET device, on a semiconductor substrate, using silicon oxide filled narrow and wide shallow trenches, with planarization of said silicon oxide filled narrow and wide shallow trenches, accomplished via dry etching procedures, applied to a level topography consisting of two layer planarization composite, composed of an underlying anti-reflective coating and an overlying photoresist, comprising the steps of:

growing a first silicon oxide layer, to be used as a pad oxide layer, on said semiconductor substrate;

depositing a silicon nitride layer on said pad oxide layer;

applying a first positive photoresist layer on said silicon nitride layer;

developing narrow and wide features in said first positive photoresist layer, using a shallow trench exposure mask;

anisotropic dry etching of said silicon nitride layer, of said pad oxide layer, and of said semiconductor substrate, using said narrow and wide features in said first positive photoresist layer, to create narrow and wide shallow trenches in said semiconductor substrate;

removal of said first positive photoresist layer;

depositing a second silicon oxide layer, completely filling said narrow shallow trenches, and completely filling said wide shallow trenches, creating an uneven topography comprised of a thick layer of said second silicon oxide, overlying said silicon oxide filled, narrow shallow trenches, and the spaces between said silicon oxide filled, narrow shallow trenches, and of a thin layer of said second silicon oxide layer, overlying said silicon oxide filled, wide shallow trenches;

applying said anti-reflective coating on said second silicon oxide layer;

baking of said anti-reflective coating;

applying a second positive photoresist layer on said anti-reflective coating, creating said two layer planarization composite, comprised of said second positive photoresist layer overlying said anti-reflective coating;

baking of said second positive photoresist layer creating a level surface topography of said two layer planarization composite, with a thicker layer of said two layer planarization composite overlying said thin second silicon oxide layer, in said wide shallow trenches, and a thinner layer of said two layer planarization layer, overlying said thick second silicon oxide layer, which overlies said silicon oxide filled, narrow shallow trenches, and the spaces between said silicon oxide filled, narrow shallow trenches;

a first planarization procedure, using dry etching, to completely remove said thinner layer, of said two layer planarization composite, in regions overlying said thick second silicon oxide layer, exposing the top surface of said thick second silicon oxide layer, while leaving some of said thicker layer, of said two layer planarization composite, in regions overlying said thin second silicon oxide layer, in said wide shallow trenches;

a second planarization procedure, using dry etching, to remove said thick second silicon oxide layer from the surface of the spaces between said silicon oxide filled, narrow shallow trenches, exposing top surface of said silicon nitride layer, as well as removing said thick second silicon oxide layer, which overlies said silicon oxide filled, narrow shallow trenches, creating a level topography between: said silicon oxide filled, narrow shallow trenches; the spaces between said silicon oxide filled, narrow shallow trenches; and said thin second silicon oxide, in said wide, shallow trenches, still protected by some of said thick layer of two layer planarization composite;

a buffered hydrofluoric acid procedure;

removal of remaining said thick layer of two layer planarization composite;

removal of said silicon nitride layer;

removal of said pad oxide layer;

growing a third silicon oxide layer, to be used for the gate insulator layer;

depositing a polysilicon layer;

patterning of said polysilicon layer to create a sub-half micron wide, polysilicon gate structure, in the space between said silicon oxide filled, narrow shallow trenches;

ion implanting a first conductivity imparting dopant into said semiconductor substrate, in the space between said silicon oxide filled, narrow shallow trenches, and not covered by said sub-half micron wide, polysilicon gate structure, to create a lightly doped source and drain region;

depositing a fourth silicon oxide layer;

anisotropic dry etching of said fourth silicon oxide layer, to create an insulator spacer on the sides of said sub-half micron wide, polysilicon gate structure; and ion implanting a second conductivity imparting dopant into said semiconductor substrate, in the space between said silicon oxide filled, narrow shallow trenches, and not covered by said sub-half micron wide, polysilicon gate structure, and not covered by said insulator spacer, to create said heavily doped source and drain region.

15. The method of claim 14, wherein said narrow shallow trench is created via RIE procedures, using $HBr—Cl_2—O_2$ as an etchant, to a depth between about 4000 to 6000 Angstroms, with a width between about 0.18 to 1.0 uM, and with spaces between said narrow shallow trench, to be used for said sub-half micron MOSFET device, being between about 0.2 to 20 uM in width.

16. The method of claim 14, wherein said wide shallow trench is created via RIE procedures, using $HBr—Cl_2—O_2$ as an etchant, to a depth between about 4000 to 6000 Angstroms, with a width between about 5 to 100 uM.

17. The method of claim 14, wherein said second silicon oxide layer, used to fill said narrow shallow trenches, and said wide shallow trenches, is obtained via LPCVD procedures, at a temperature between about 450° to 750° C., to a thickness between about 5000 to 7000 Angstroms, using tetraethylorthosilicate as a source.

18. The method of claim 11, wherein the topography difference in height between said thick silicon oxide layer, on the top surface of the space between said narrow shallow trenches, and said thin silicon oxide layer, in said wide shallow trenches, is between about 5000 to 7000 Angstroms.

19. The method of claim 14, wherein said anti-reflective coating is applied to a thickness between about 1000 to 2000 Angstroms.

20. The method of claim 14, wherein said anti-reflective coating is baked at a temperature between about 200° to 250° C.

21. The method of claim 14, wherein said second positive photoresist layer is baked at a temperature between about 200° to 250° C.

22. The method of claim 14, wherein said two layer planarization composite is between about 1500 to 3000 Angstroms thicker in regions overlying said thin second silicon oxide layer, than in regions overlying said thick second silicon oxide layer.

23. The method of claim 14, wherein said first planarization procedure is performed via RIE procedures, using $O_2—CHF_3—Ar$ as an etchant.

24. The method of claim 14, wherein said second planarization procedure is performed via RIE procedures, using $CHF_3—CF_4—Ar$ as an etchant, with an etch rate ratio between about 10 to 3, between silicon oxide and photoresist.

25. The method of claim 14, wherein the width of said sub-half micron, polysilicon gate structure, is between about 0.2 to 2.0 uM.

26. The method of claim 14, wherein the channel length of said sub-half micron MOSFET device, fabricated in the space between said narrow shallow trenches, is between about 0.2 to 2.0 uM.

* * * * *